US012769511B2

(12) United States Patent
Gort

(10) Patent No.: US 12,769,511 B2
(45) Date of Patent: Oct. 20, 2026

(54) DYNAMIC BLOCK SIZE CARRY-SKIP ADDER CONSTRUCTION ON FPGAs BY COMBINING RIPPLE CARRY ADDERS WITH ROUTABLE PROPAGATE/GENERATE SIGNALS

(71) Applicant: EFINIX, INC., Santa Clara, CA (US)

(72) Inventor: Marcel Gort, Toronto (CA)

(73) Assignee: EFINIX, INC., Santa Clara, CA (US)

( * ) Notice: Subject to any disclaimer, the term of this patent is extended or adjusted under 35 U.S.C. 154(b) by 1183 days.

(21) Appl. No.: 17/539,997

(22) Filed: Dec. 1, 2021

(65) Prior Publication Data

US 2022/0244912 A1 Aug. 4, 2022

Related U.S. Application Data

(60) Provisional application No. 63/144,875, filed on Feb. 2, 2021.

(51) Int. Cl.
*G06F 7/506* (2006.01)
*G06F 7/501* (2006.01)
(Continued)

(52) U.S. Cl.
CPC .............. *G06F 7/506* (2013.01); *G06F 7/501* (2013.01); *G06F 30/343* (2020.01); *H03K 19/17724* (2013.01)

(58) Field of Classification Search
CPC ........ G06F 7/501; G06F 7/505; G06F 7/5057; G06F 7/506; G06F 7/508; G06F 7/405;
(Continued)

(56) References Cited

U.S. PATENT DOCUMENTS 5,337,269 A * 8/1994 McMahan ............... G06F 7/506 708/711
5,555,517 A 9/1996 Agrawal et al.
(Continued)

FOREIGN PATENT DOCUMENTS

CN 103631560 A 3/2014
CN 110633068 A 12/2019
WO 03/60672 A1 7/2003

OTHER PUBLICATIONS

M. Lehman and N. Burla, "Skip Techniques for High-Speed Carry-Propagation in Binary Arithmetic Units," in IRE Transactions on Electronic Computers, vol. EC-10, No. 4, pp. 691-698, Dec. 1961 (Year: 1961).*

(Continued)

*Primary Examiner* — Andrew Caldwell
*Assistant Examiner* — Phat N Le
(74) *Attorney, Agent, or Firm* — Womble Bond Dickinson (US) LLP

(57) ABSTRACT

An adder is implemented in a field programmable gate array (FPGA). The adder has a first ripple carry adder block, for least significant bits of the adder. The adder has a plurality of carry skip adder blocks of differing block sizes. Each block size relates to bit-width of input to a block. The carry
(Continued)

Using 4-LUT to Implement Adder skip adder blocks of differing block sizes are for a plurality of bits of the adder. The adder has a second ripple carry adder block, for most significant bits of the adder.

21 Claims, 8 Drawing Sheets

(51) Int. Cl.
*G06F 30/343* (2020.01)
*H03K 19/17724* (2020.01)

(58) Field of Classification Search
CPC . G06F 7/42; G06F 30/30; G06F 30/32; G06F 30/34; G06F 30/343; H03K 19/17724; H03K 19/17728
See application file for complete search history.

(56) References Cited

U.S. PATENT DOCUMENTS 5,724,276 A * 3/1998 Rose .................... G06F 7/5057 708/700
6,199,091 B1 3/2001 Kobayashi et al.
2016/0246571 A1* 8/2016 Walters, III ........... G06F 7/5057
2017/0322775 A1* 11/2017 Padalia ................... G06F 7/575
2018/0300107 A1 10/2018 Rao

OTHER PUBLICATIONS

H. M. Kamboh and S. A. Khan, "FPGA implementation of fast adder," 2012 7th International Conference on Computing and Convergence Technology (ICCCT), Seoul, Korea (South), 2012, (Year: 2012).*
Wikipedia—Carry-skip adder (Year: 2016).*
P. K. Chan and M. D. F. Schlag, "Analysis and design of CMOS Manchester adders with variable carry-skip," in IEEE Transactions on Computers, vol. 39, No. 8, pp. 983-992, Aug. 1990 (Year: 1990).*
Sneha H. L., Purpose and Internal Functionality of FPGA Look-Up Tables, Nov. 9, 2017, allaboutcircuits (Year: 2017).*
CN Office Action, Including Search report received for Chinese Patent Application No. 202210108842.3, mailed on May 28, 2025, 12 pages (6 pages of English Translation and 6 pages of Original Document).
CN Notice of Allowance, including Search Report received for Chinese Patent Application No. 202210108842.3, mailed on Sep. 29, 2025, 8 pages (4 pages of English Translation and 4 pages of Original Document).

* cited by examiner

DYNAMIC BLOCK SIZE CARRY-SKIP ADDER CONSTRUCTION ON FPGAs BY COMBINING RIPPLE CARRY ADDERS WITH ROUTABLE PROPAGATE/GENERATE SIGNALS

This application claims benefit of priority from U.S. Provisional Application No. 63/144,875, titled DYNAMIC BLOCK SIZE CARRY-SKIP ADDER CONSTRUCTION ON FPGAS BY COMBINING RIPPLE CARRY ADDERS WITH ROUTABLE PROPAGATE/GENERATE SIGNALS and filed Feb. 2, 2021, which is hereby incorporated by reference.

BACKGROUND

Addition is common in digital design, and so modern FPGAs have circuitry dedicated to implementing this functionality. Rather than using pure lookup tables (LUTs) to implement addition, FPGAs are often augmented with circuitry dedicated to the efficient implementation of adders. Typically, full adders (e.g., each having inputs A, B and carry in, and outputs carry and sum) are connected in one of two ways to implement wider adders.

One simple way to implement wider adders is to add dedicated routing from the carry out of a full adder to the carry in of another full adder directly, which can be used to implement a fast ripple carry adder (RCA). The critical path through a ripple carry adder is dominated by the ripple carry path, which grows linearly with the width of the adder that relates to the bit widths of the inputs of the adder and the bit width of the output of the adder. This type of adder is typically quite fast when designed for adding low bit widths but can become quite slow for high bit widths because of the resultant long delays through the lengthy ripple carry path.

Another alternative used in FPGAs to implement wider adders is adding dedicated carry lookahead adder (CLA) circuitry with a fixed block size (K) in a logic block cluster. Block size relates to width or bit width of the block, and more specifically to bit widths of inputs and/or output(s) of a block. This carry look ahead adder circuitry is used to pre-compute whether a group of full adders each of block size K will ignore the incoming carry in, propagate the incoming carry in, or generate a carry out regardless of the value of the carry in. This CLA circuitry speeds up the ripple path, which has a critical path that scales linearly with number of bits/K. The choice of K is a tradeoff that FPGA architects must make up front. A larger value of K will provide better performance for wide adders, but will incur a higher fixed area penalty.

Additional work has shown that the LUTs and adders on FPGAs can be used to implement complex parallel prefix adders, which can be faster for very high bit widths. However, because there is no architectural support for these structures, there is significant area overhead to doing this in a typical FPGA.

BRIEF SUMMARY

Embodiments described herein implement a class of fast carry-skip adders using a combination of existing RCA adder circuitry, which is modified to make propagate and generate signals routable, and soft logic. Techniques described herein allow fast carry-skip adders to be created with variable block size with minimal architecture modifications. In one embodiment, the architecture modifications do not dictate the block size, so the block size(s) that form an adder are decided at compile time, as a trade-off between area and speed. Larger block sizes lead to higher area overhead, while lower block sizes lead to lower area overhead. For low bit-width adders, a standard RCA can be implemented to avoid any soft-logic area overhead.

One embodiment disclosed herein is an adder implemented in a field programmable gate array (FPGA). The adder has a first ripple carry block, for least significant bits of the adder. The adder has a plurality of carry skip adder blocks of differing block sizes. Each block size relates to a bit-width of input to a block. The plurality of carry skip adder blocks is for a plurality of bits of the adder. The adder has a second ripple carry adder block, for most significant bits of the adder.

One embodiment disclosed herein is a computer aided design (CAD) method that is practiced by a CAD system. The method includes receiving instruction to implement an adder in a field programmable gate array (FPGA), and generating the adder in a format for programming the FPGA. The adder includes a first ripple carry block, for least significant bits of the adder. The adder includes a plurality of carry skip adder blocks of differing block sizes, for a plurality of bits of the adder. Each block size relates to bit-width of input to a block. The adder includes a second ripple carry block, for most significant bits of the adder.

One embodiment disclosed herein is a tangible, non-transitory, computer-readable media that has instructions thereupon. When the instructions are executed by a processor, this causes the processor to perform a method. The method includes receiving instruction to implement an adder in a field programmable gate array (FPGA), and programming the FPGA to implement the adder. The adder includes a first ripple carry adder block, for least significant bits of the adder. The adder includes a plurality of carry skip adder blocks of differing block sizes. Each block size relates to bit-width of input to a block. The plurality of carry skip adder blocks is for a plurality of bits of the adder. The adder includes a second ripple carry adder block, for most significant bits of the adder.

In one embodiment, the area/speed tradeoff can be decided as follows:

1) By the user with a global option to improve, and potentially optimize, the entire design for area or speed;
2) Using a parameterized adder IP core that the user can configure to skew more towards area or speed;
3) Using physical synthesis techniques to start with the area optimized adder, then modify the block sizes to target speed only for adders on the critical path.

Adder embodiments disclosed herein have one or more of the following advantages compared to using a hardened carry lookahead adder:

- Reduced, and potentially minimal, area overhead compared to the simple RCA, so FPGA die size is smaller compared to implementing carry lookahead adder circuitry.
- Critical path delay scales sub-linearly because block size can be increased as carry chain length increases.
- Variable block sizes can be used to offer compelling performance advantages at a wide range of bit-widths.
- Does not require a clustered FPGA architecture.

BRIEF DESCRIPTION OF DRAWINGS

Embodiments described herein will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, numerous details are set forth to provide a more thorough explanation of the present embodiments. It will be apparent, however, to one skilled in the art, that the present invention may be practiced without these specific details. In other instances, well-known structures and devices are shown in block diagram form, rather than in detail, in order to avoid obscuring the present embodiments.

Techniques are described herein for creating a class of fast carry-skip adder structures on FPGAs with low area overhead versus plain ripple carry adders (RCA) using a modified version of the standard hardened RCA that drives the routing fabric with the propagate and generate signals.

Figure 1:
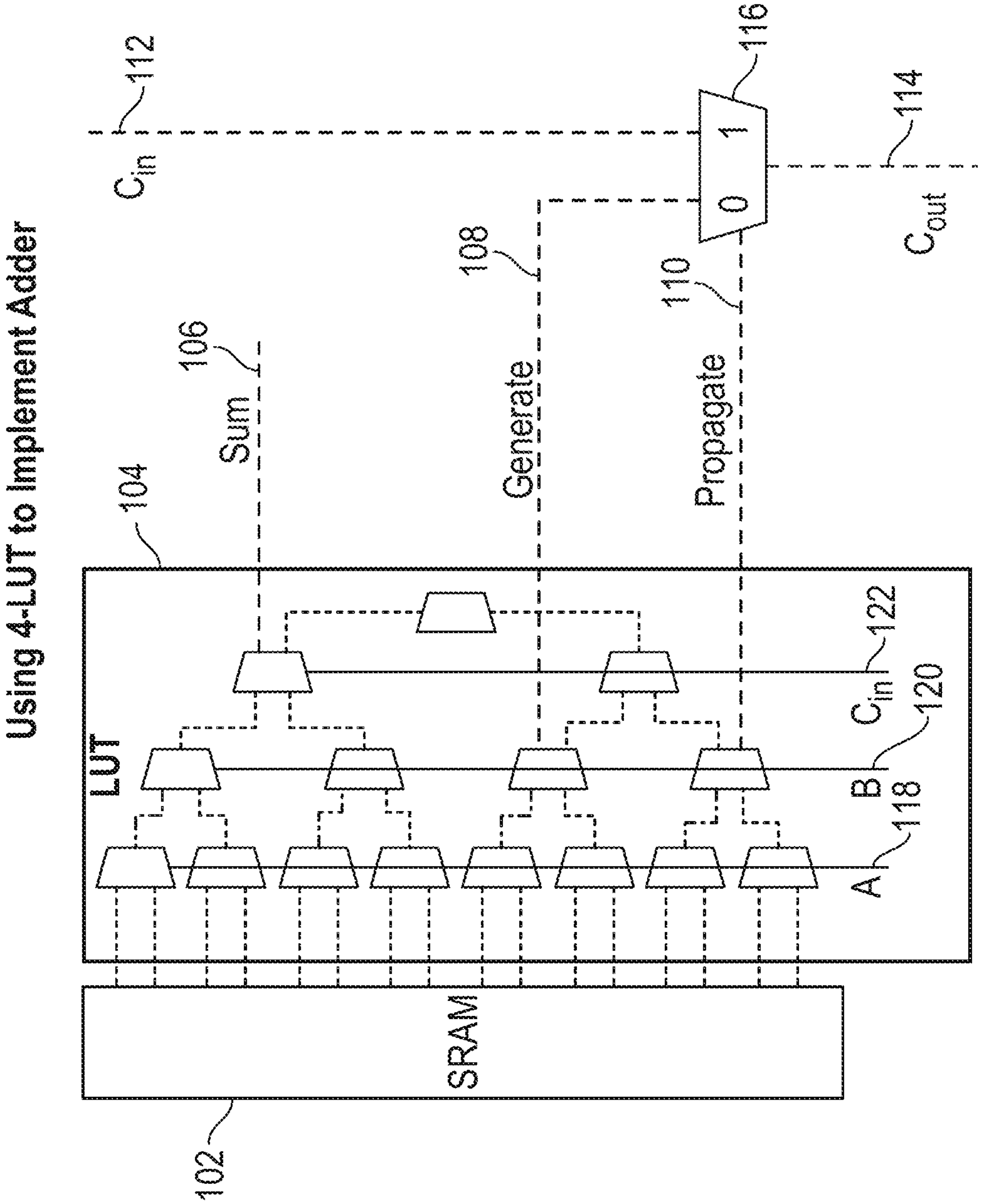
FIG. 1 shows a standard full adder implemented using a 4-LUT and an extra 2:1 carry ripple mux.

FIG. 1 illustrates one embodiment of a 4-LUT (four level lookup table) 104 decomposed to implement the propagate 110, generate 108 and sum 106 functions. In various embodiments, a lookup table is a block, in an FPGA, that has multiplexers arranged in multiple levels. Some embodiments of lookup tables generally, and some embodiments of the 4-LUT specifically, have half adders, for example each with inputs A and B and outputs carry and sum, as blocks within a block. Referring to FIG. 1, the bottom half of the 4-LUT is used to create the propagate 110 and generate 108 signals, which both use inputs A and B. The sum 106 is implemented using a 3-LUT in the top half of the 4-LUT 104 and has inputs 118, 120, 122 AB/Cin. An additional 2:1 mux 116 (i.e., a multiplexer) is used to generate the carry out signals. If the propagate 110 signal (alternatively, the propagate carry) is asserted, then the carry in 112 (Cin) signal is selected by the mux 116, for carry out 114 (Cout). Otherwise, generate 108 signal (alternatively, the generate carry) is selected by the mux 116, for carry out 114 (Cout).

In some embodiments, the full adder, implemented using a 4-LUT 104 in FIG. 1, operates as follows. Operands A and B, which are inputs to the adder, are loaded into the SRAM (static random access memory) 102. The first level of muxes of the 4-LUT 104, controlled by input A 118, selects the value of "A" from the SRAM 102, to propagate to the second level of muxes of the 4-LUT 104. The second level of muxes of the 4-LUT 104, controlled by input B 120, selects from among the values propagated by the first level of muxes, and produces generate 108 (alternatively termed generate carry), propagate 110 (alternatively termed propagate carry), and values to propagate to the third level of muxes for generating the sum 106. In the third level of muxes of the 4-LUT 104, one of the muxes is controlled by the carry in 122 (Cin) and selects from among the values propagated by the second level of muxes, thus generating sum 106. Propagate 110 controls the mux 116, selecting the carry in 122 or the generate 108 according to the value of propagate 110, for the carry out 114. The mux in the fourth level of the 4-LUT 104 is unused in this example.

Figure 2:
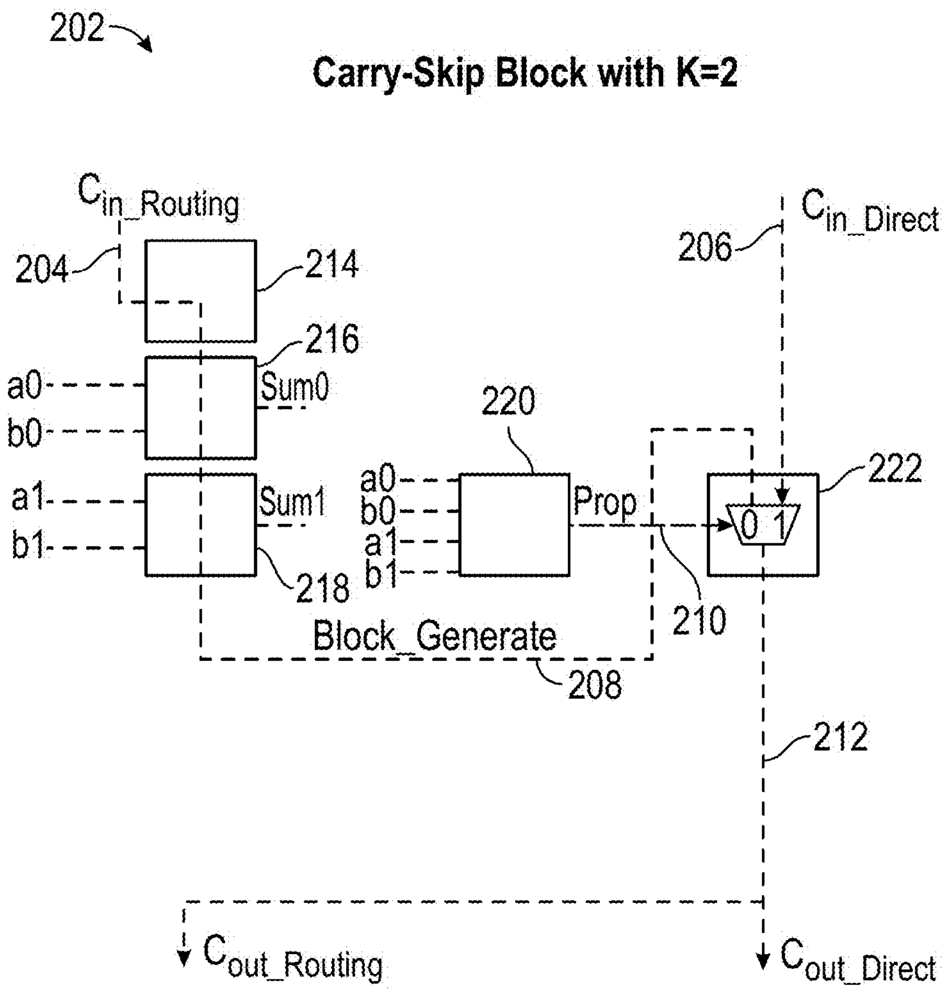
FIG. 2 shows one embodiment of a K=2 carry skip adder block.

FIG. 2 shows one embodiment of a carry skip block with block size 202 K=2 implemented using the proposed architecture. In keeping with the block size 202, each of the inputs "a" (e.g., a1, a0) and "b" (e.g., b1, b0) and the output (e.g., sum1, sum0) has a bit width of two. Referring to FIG. 2, the sum (e.g., sum1, sum0) is generated as normal from the full adders 216 and 218 on the left. The block propagate 210 is generated using a single 4-LUT 220 (see for example FIG. 1) as it is a function of inputs a0, a1, b0, b1. The block generate 208 is the carry out from the carry ripple of the 2-bits, from the carry in routing 204 (Cin_routing) propagating through a block 214 and the two full adders 216, 218. Note that the block generate 208 does not depend on the carry in direct (206) (Cin_direct) if block propagate 210 is false, which is the only case in which the block generate 208 is used, e.g., selected by the mux 222 for the carry out 212 which is then passed out of the block as carry out direct (Cout_direct) and carry out routing (Cout_routing). For that reason, carry in (Cin) to block generate is a false path. The block generate 208 and propagate 210 are then routed to another full adder block (not shown but readily envisioned) using general routing. That other full adder block implements the block ripple carry. The carry skip block precomputes the carry propagate and the carry generate signals for the group, so that the carry does not have to ripple through all of the full adder blocks within the carry skip block.

Figure 3:
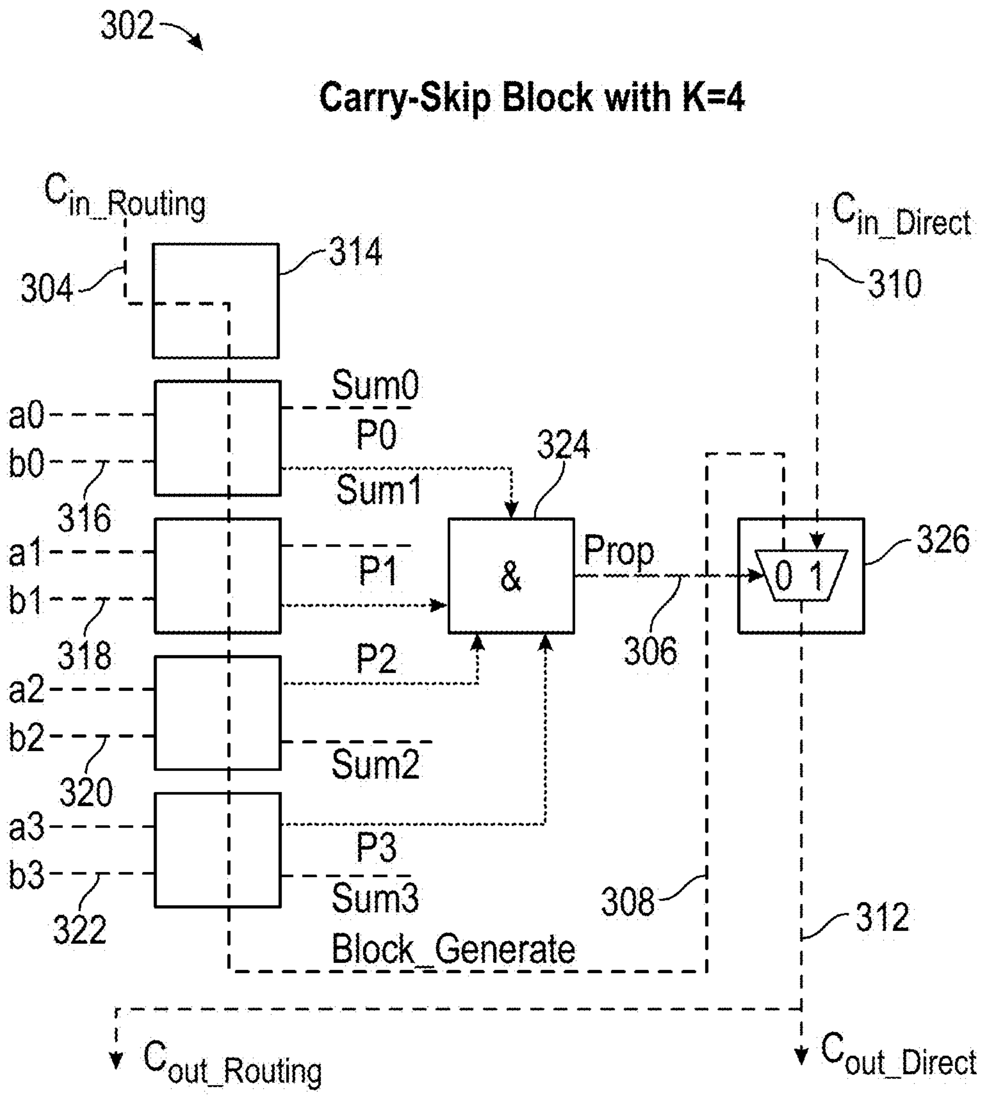
FIG. 3 shows the one embodiment of a K=4 carry skip adder block.

FIG. 3 shows one embodiment of a carry skip block with block size 302 implemented with the proposed architecture of K=4. This is similar to the embodiment in FIG. 2 except that inputs and output sum are four bits wide in keeping with block size 302, there are four, one bit-width full adders 316, 318, 320, and 322, and the block propagate 306 is generated by ANDing the propagate signals from each individual full adder of adders 316, 318, 320, and 322 on the left, through AND block 324. This approach, using a wide AND to generate the propagate 306, saves area for K>2. Carry in routing 304 propagating through a block 314 and full adders to produce block generate 308, carry in direct 310, carry out 312 generation by mux 326 to carry out direct and carry out routing are also similar to the embodiment in FIG. 2.

Figure 4:
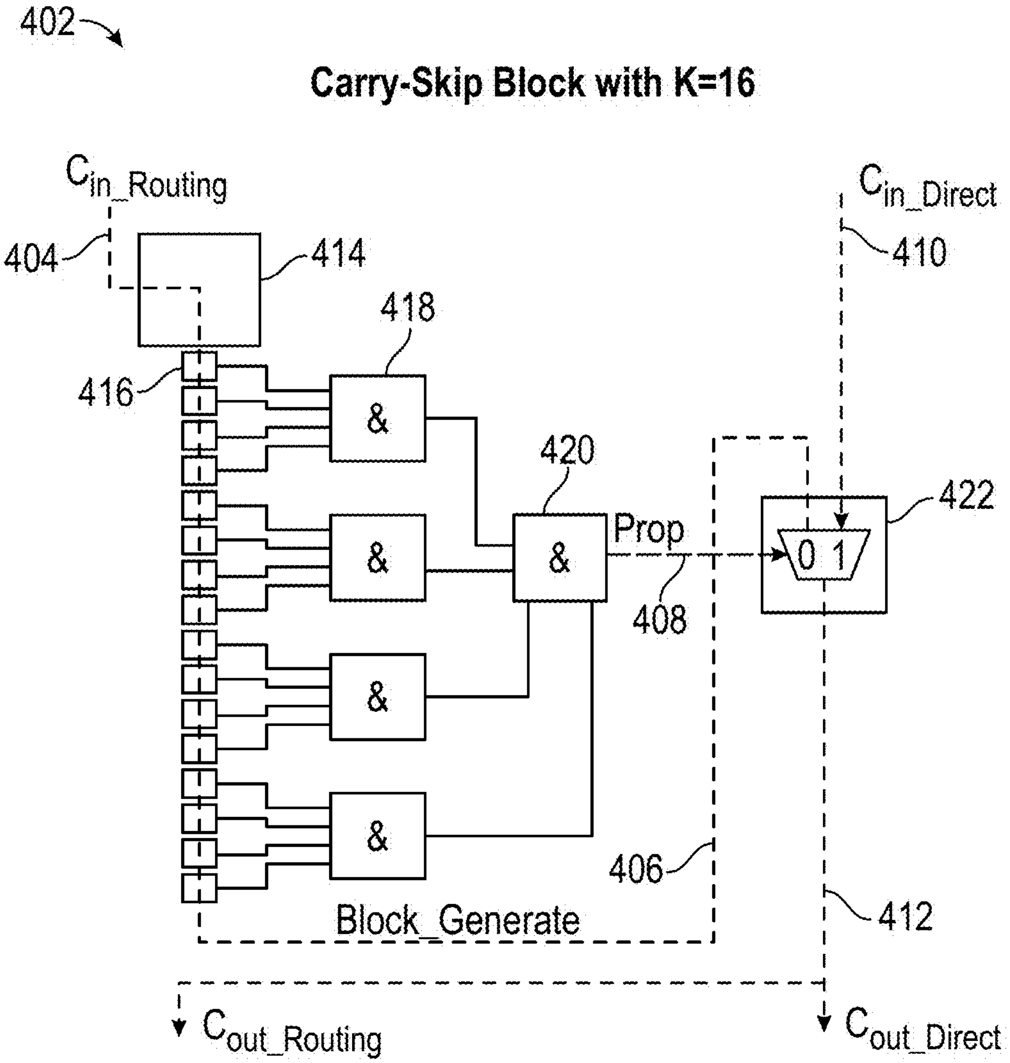
FIG. 4 shows the one embodiment of a K=16 carry skip adder block.

FIG. 4 shows one embodiment of a carry skip block with block size 402 implemented with the proposed architecture of K=16. Note that compared to FIG. 3, there is an extra level of 4-LUTs arranged as AND blocks 418 connected to AND block 420 to AND together the propagate signals from the sixteen, one bit-width full adders 416 on the left. This approach, using a wide AND to generate the propagate 408, saves area for K=16. Carry in routing 404 propagating through a block 414 and full adders to produce block generate 406, carry in direct 410, carry out 412 generation by mux 422 to carry out direct and carry out routing are also similar to the embodiments in FIG. 2 and FIG. 3.

Figure 5:
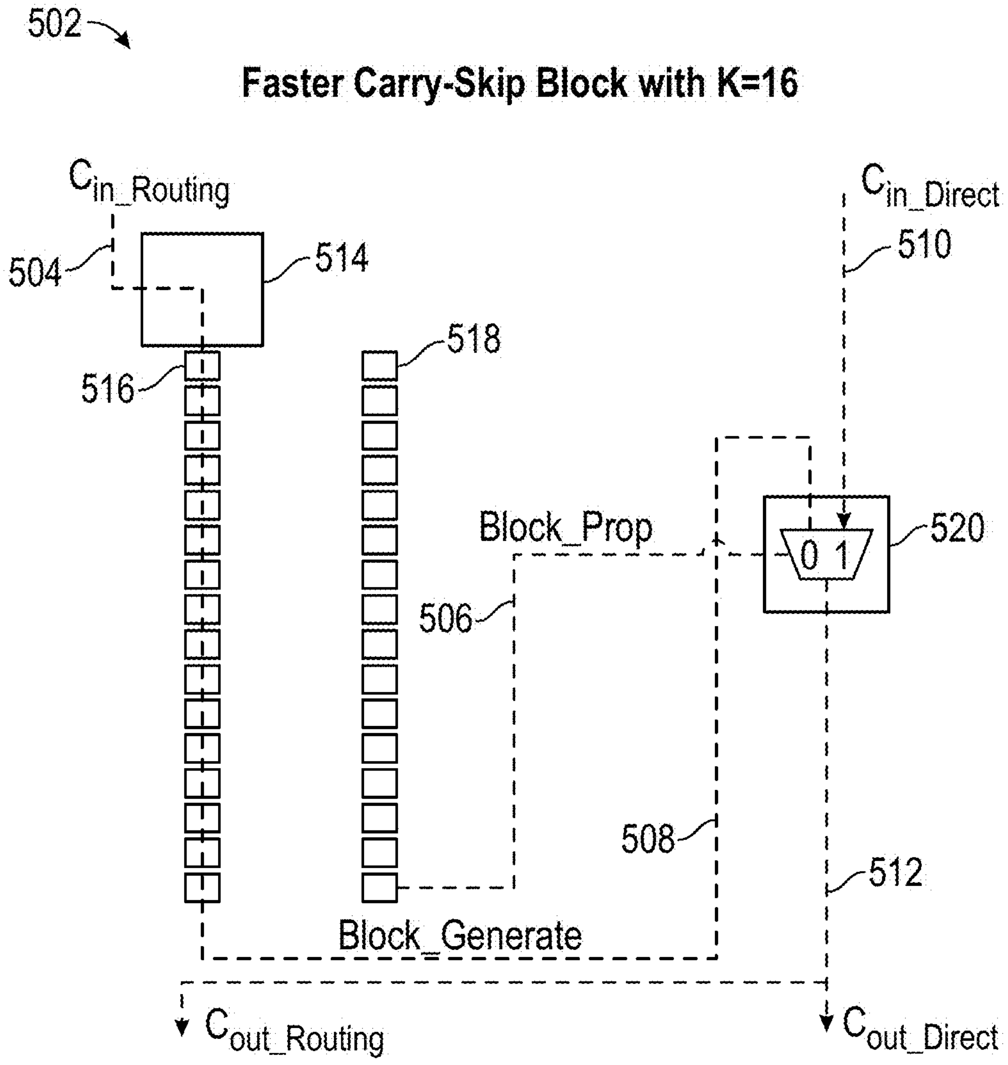
FIG. 5 shows one embodiment of a faster K=16 carry skip adder block.

FIG. 5 shows generating the block generate 508 signal by using the ripple carry adder 516 to implement a wide AND function. By modifying the LUTMASK (lookup table mask) of the LUTs in the ripple path, the functionality can be changed from an adder to a bitwise AND. FIG. 5 shows one embodiment of a carry skip block with block size 502 of K=16, with a faster carry-skip block architecture in comparison to the embodiment shown in FIG. 4. Block generate 508 is produced by the wide AND function of the ripple carry adder 516. Carry in routing 504 propagating through a block 514 and carry adder 516 to produce block generate 508. Block propagate 506 is produced by the blocks 518. Carry in direct 510, carry out 512 generation by mux 520 to carry out direct and carry out routing are similar to the embodiments in FIG. 2, FIG. 3 and FIG. 4.

With reference to the carry skip adder embodiments in FIGS. 2-5, any number of lookup tables with half adders can be attached together to generate a group carry propagate for the block, which handles any number of bits, practically limited of course by device size. FIGS. 2-5 show how the block carry generate and block carry propagate are created. Block carry generate determines whether the carry out is generated regardless of the carry in value. Also, block carry propagate determines whether to propagate the group carry in to carry out. This is called soft logic, and in order to implement such in an adder embodiment, the carry propagate is accessed by regular routing, which may not usually be the case in FPGA architectures outside of present embodiments. In some embodiments, the carry propagate signal comes from the internal circuitry of the half adder and is exposed for external routing (i.e., routing outside of the half adder), for example as an output port of a lookup table or of the logic block. The carry propagate signal for each carry skip adder block of size K, in a carry skip adder embodiment, goes to one bit of the carry chain, which acts as the group carry chain. Also, the carry generate signal comes from the internal circuitry of the half adder and is exposed for external routing, and goes to the same one bit of the carry chain (see multiplexer generating carry out, in FIGS. 1-5). Because of this architecture, the critical path is from the carry in to the carry out, which can be very fast especially with hardened logic for that one bit of the carry chain. Hardened logic here means a dedicated, fast circuit, not one built up from other programmable, configurable elements. Soft logic, by contrast, here means programmable, configurable logic that can be used to build up logic circuitry for a specified function(s) through programming the FPGA. Exposing the carry propagate signal and the carry generate signal from the internals of the block enables building the carry skip adder. Dedicated, specific-sized multiplexers are used in various embodiments, for example for the hardened logic, although dedicated, specific-sized combinatorial logic could be used in further embodiments. The use of hardened logic, for example specific multiplexers, in the critical path of the carry allows the group carry ripple to go through the hardened logic and be very fast in comparison to soft logic.

Figure 6:
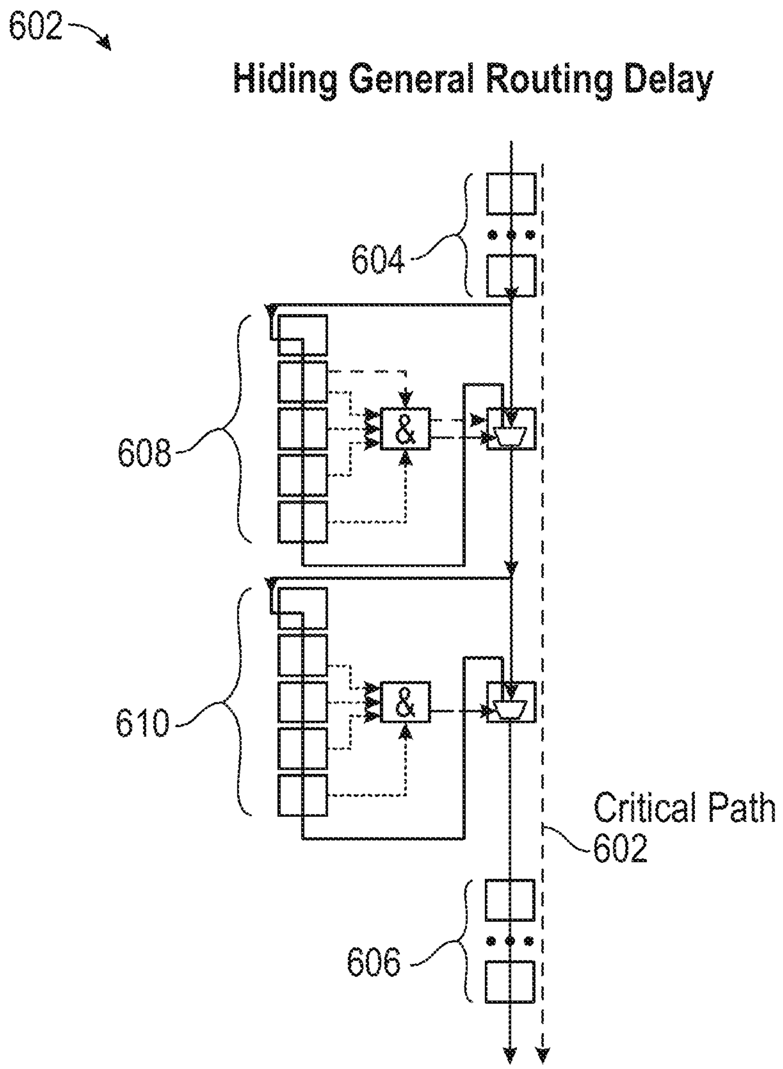
FIG. 6 shows building a carry skip adder using a combination of block sizes to hide the general routing delay.

FIG. 6 shows the latency of created block generate/propagate signals is hidden by starting and ending a carry skip adder with a plain RCA. This means that the delay of one embodiment of the variable block size carry skip adder is never slower than a plain RCA. FIG. 6 shows an embodiment of an adder composed of a ripple carry adder 604 (here shown having two or more one bit-width adders) for the least significant bits of input and output, a carry skip adder composed of two carry skip adders 608, 610 each of block size K=4 for the middle bits of input and output, and a ripple carry adder 604 (here shown having two or more one bit-width adders) for the most significant bits of input and output. In the example depicted in FIG. 6, even though there are 5 LUTs in a block, it is a K=4 block because the first LUT is only used to route the carry in from general purpose logic to the dedicated carry path leading to the adder. That is, the topmost LUT does not implement a full adder. The critical path 602 for the carry of the adder propagates through the ripple carry adder 604, carry skip adders 608, 610 and the ripple carry adder 606. But, because carry logic in carry skip adders is relatively fast, critical path 602 is faster than would be the case for the critical path for carry of a comparable sized ripple carry adder that could be implemented in the same technology, for example in an FPGA. In other words, for other factors being equal (such as technology, circuit delays for a given element, bit-width), the architecture of the variable block size carry skip adder, with ripple carry adders for least significant bits and most significant bits, as shown in FIG. 6 produces a faster carry on the critical path 602 than does a ripple carry adder. These features are generalized in further embodiments of adders with various widths of ripple carry adders and various widths and corresponding block sizes of carry skip adder blocks.

Figure 7:
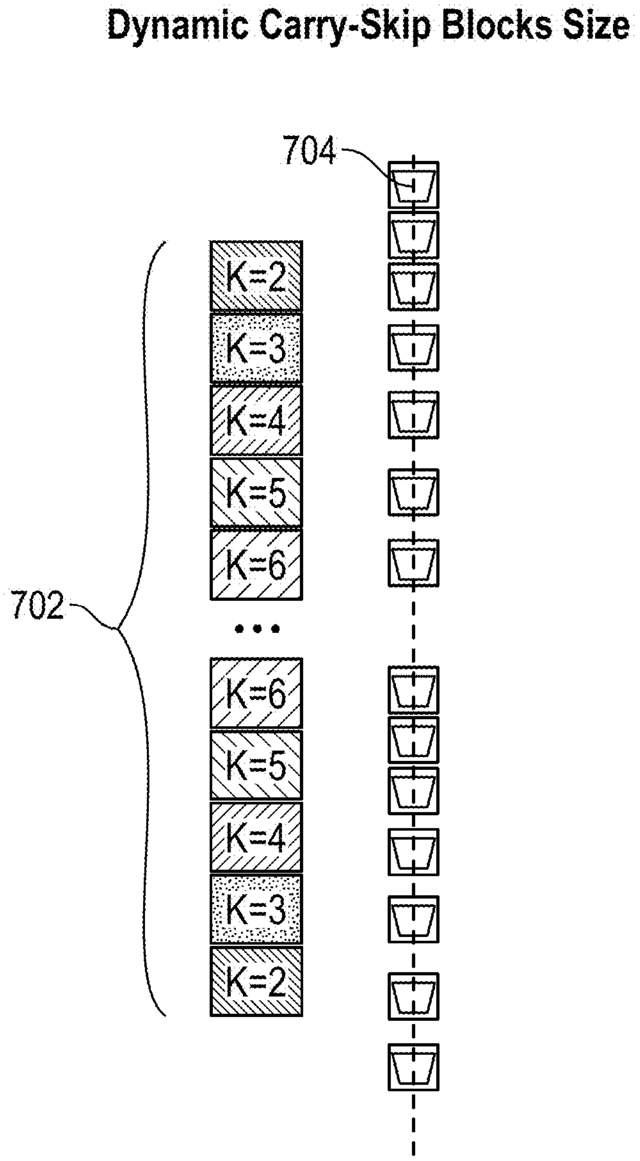
FIG. 7 shows choosing variable block sizes to optimize for overall adder delay.

FIG. 7 shows optimal block sizing for a dynamic carry skip adder to reduce, and potentially minimize, critical path delay. Note that in one embodiment block sizes of carry skip adder blocks 702 are chosen to calculate the maximum number of adder bits that can be computed in a given stage or block of the adder without creating a critical path in the propagate/generate logic of the carry skip adder blocks 702 that would slow down carry propagation in the critical path 704 of the carry of the adder.

In the embodiment shown in FIG. 7, the block sizes of the carry skip adder blocks 702 increase from K=2, at a lower significant bit end of the carry skip adder blocks 702, to K=6 towards the middle bit(s) of the adder, and decrease from the middle bit(s) of the adder to K=2 towards a more significant bit end of the carry skip adder blocks 702. This feature(s) is generalized in further embodiments of adders with various values of block size, and various increments and decrements in block size through the implemented adder.

In one embodiment, in terms of block size choice, the adder structure can be chosen by the user by specifying whether the CAD tool should focus more on area or performance (which is a global option that affects the whole design), with a parameterized adder module that the user can instantiate in their design (e.g., the user can specify parameters that control the structure of the adder), using physical synthesis techniques to start with the area optimized adder, then modify the block sizes to target speed only for adders on the critical path.

Thus, as described above, the carry skip adder structure(s) are implemented efficiently on an FPGA using a mix of hardened resources and soft logic/routing. Included in the range of embodiments are at least the following features, and the capability of a CAD system to generate adder implementations that have various combinations of these features.

An adder structure that uses routed propagate and generate signals from adder logic to create carry skip adder structures.

An adder structure that has variable carry skip block sizes to hide routing delay associated with generating group propagate and generate signals.

An adder structure that has customized block sizes in the adder structure to trade-off adder area for performance.

An adder structure that includes a ripple carry structure to generate a wide AND for the purpose of fast block propagate generation.

An adder structure having two or more of the preceding features.

Further features that various embodiments have in various combinations are as follows.

Critical path delay for carry of the adder is lower in comparison to critical path delay for carry of a ripple carry adder that could be implemented in the FPGA as having same overall input bit-width as the adder.

Area of the adder, in the FPGA, is lower in comparison to area of a carry skip adder that could be implemented in the FPGA as composed of carry skip adder blocks having a fixed block size equal to a largest of the differing block sizes.

Figure 8:
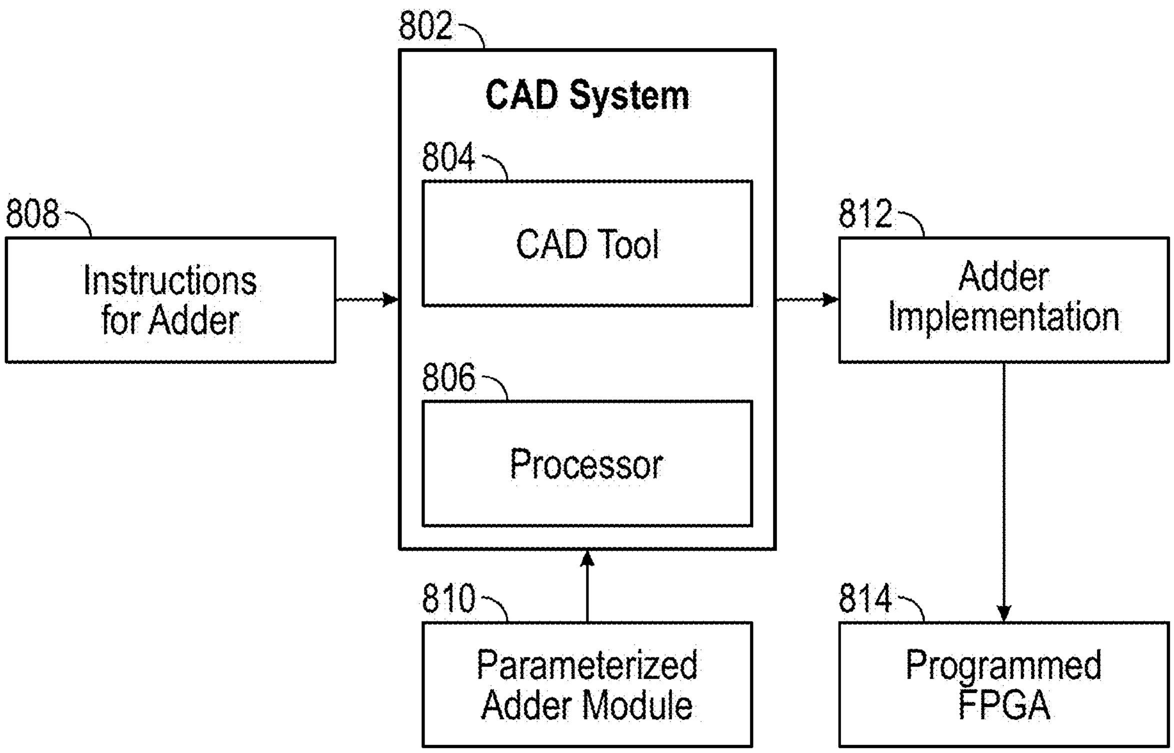
FIG. 8 shows one embodiment of a computer aided design (CAD) system that implements various embodiments of adders in accordance with the present disclosure.

FIG. 8 shows one embodiment of a computer aided design (CAD) system 802 that implements various embodiments of adders in accordance with the present disclosure. A CAD tool 804 executing on a processor 806 receives instructions for adder 808, for example from a user in an appropriate format (e.g., a file in RTL, i.e., register transfer language, Verilog or VHDL coding, etc.) for the CAD tool 804. The CAD tool 804 generates the adder implementation 812, using the parameterized adder module 810, outputting for example in an appropriate format for use in programming an FPGA. The CAD system 802, or other system, can then program the FPGA, resulting in the programmed FPGA 814 that has the adder implementation 812. In various embodiments, the various aspects and features of the embodiments described above are automated by, or user-selected in cooperation with, the CAD tool 804. In further embodiments, the various aspects and features of the embodiments described above further apply in various combinations to other types of integrated circuits, and CAD tools and CAD systems for other types of integrated circuits, such as full custom, ASIC (application specific integrated circuit), PLD (programmable logic device), etc.

In various embodiments, synthesis creates the entire adder as one block, in a hierarchical structure that has blocks within blocks. For example, if instructed to implement a 32 bit adder, the CAD tool 804 creates all the block sizes that are used to create a carry skip version of the adder. In some embodiments, the CAD tool 804 explores trade-offs, for example the bigger the block size, the longer it takes to create group, generate and propagate signals. Returning to the example of a 32 bit adder, the CAD tool 804 could split the design into four groups of eight or eight groups of four, and analyze critical path, then select which of the two possibilities is optimal for timing of carry. The CAD tool 804 could determine timing for a four bit ripple adder, and compare timing for a four bit carry skip adder. Such comparisons can be performed for various stages of an adder, with various combinations of block sizes.

It has been found that, as the size and width of the adder increases, the time it takes to compute for the carry scales sub-linearly. And, comparing critical path for a ripple carry adder, the time it takes to compute for the carry scales in a linear relationship with the width of the adder. Accordingly, it has been found that, below a certain bit width, a ripple carry adder is fastest. Such a bit width could be used as a threshold value, in the CAD tool 804. Instructed to implement an adder of a bit width below or equal to the threshold value, the CAD tool 804 could implement a ripple carry adder. Greater than that, the CAD tool 804 can implement an adder that begins and ends with a ripple carry adder, i.e., one ripple carry adder for the lower bits, and another ripple carry adder for the upper bits, and has a carry skip adder, or multiple carry skip adder blocks of various block sizes, for the middle bits.

At the beginning, the CAD tool 804 can start with a low block size, for example a block size of two. Then there is an additional threshold where it makes sense, analytically, to increase the block size for the next block(s) and still be below the delay to keep up with the ripple through the critical path of the carry. This is what is meant by hiding the general routing delay, in various embodiments. Delay for the carry generate and carry propagate signals for a given carry skip adder block are compared to delay along the critical path of the carry for the assembled adder, then acceptable block size for that carry skip adder block (and sub-critical delay for block carry generate and block carry propagate signals) is determined based on this comparison.

At some point, for example about midway through the adder, it is possible that adding a large block would create a new critical path to generate sum bits. Adding a smaller block, which takes less delay to generate the later or last sum bits of the adder avoids this new critical path. The CAD tool 804 could proceed in this direction, generating smaller block sizes towards the more significant bits of the adder. Then the final bits for the adder could be implemented with another ripple carry adder, which would be faster than another carry skip adder block. Past the middle of the adder, the CAD tool 804 could create smaller block sizes and keep reducing block size because there is less delay that can be masked by the end of the ripple.

Some embodiments of the CAD tool 804 optimize block sizes of an adder implemented with variable block sizes by balancing the delay through ripple in the carry chain and delay in the block carry generate and block carry propagate signals. Using larger block sizes means fewer stages of ripple in the critical path of the carry, which speeds up the carry propagation but makes the sum generation slower.

One embodiment of the CAD tool 804 looks at each bit of the adder and determines how to compute the sum for the next group of bits, e.g., will that be one bit at a time, two bits at a time, three or four bits at a time, etc. Two factors go into the decision, one is to have enough delay to generate the group generate signal earlier than the delay that has been accumulated thus far in the critical path for the carry. The other factor is generation of the sum bits taking into account ripple through a link which is through general-purpose routing. It is acceptable to make some signals slower because they are not in the critical path, and that dictates how big a block size may be. There is an outward constraint and an input constraint. Towards the more significant bit end of an adder, the sum bits might be slowed down and become the critical path. From an algorithm point of view, one determination is whether it is creating a new critical path by generating a block, and if so, then try a smaller block.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. An adder implemented in a field programmable gate array (FPGA), comprising:

a first ripple carry adder block, for least significant bits of the adder;

a plurality of carry skip adder blocks of differing block sizes, each block size relating to bit-width of input to a block, for a plurality of bits of the adder;

each carry skip adder block implemented in the FPGA using a multi-level lookup table (LUT) comprising a plurality of cascaded multiplexer stages configured to implement at least a half-adder function, wherein a block carry propagate signal of the carry skip adder block is derived from internal circuitry of the half-adder function, the internal circuitry being distinct from a normal LUT output, and wherein the block carry propagate signal is exposed for external routing outside of the half-adder function and outside of the multi-level LUT for use across LUT boundaries; and a second ripple carry adder block, for most significant bits of the adder.

2. The adder implemented in the FPGA of claim 1, wherein:

each of the plurality of carry skip adder blocks coupled to receive as inputs routed propagate carry and generate carry signals from full adder logic blocks in a skip adder structure.

3. The adder implemented in the FPGA of claim 1, wherein:

critical path delay for a carry of the adder is lower in comparison to critical path delay for a carry of a ripple carry adder that could be implemented in the FPGA as having a same overall input bit-width as the adder.

4. The adder implemented in the FPGA of claim 1, wherein:

area of the adder, in the FPGA, is lower in comparison to an area of a further carry skip adder that could be implemented in the FPGA composed of carry skip adder blocks having a fixed block size equal to a largest of the differing block sizes of the plurality of carry skip adder blocks of the adder.

5. The adder implemented in the FPGA of claim 1, wherein:

the differing block sizes increase from a first carry skip adder block, at a first end of the plurality of carry skip adder blocks, towards at least one carry skip adder block in a middle of the plurality of carry skip adder blocks and decrease from the at least one carry skip adder block in the middle of the plurality of carry skip adder blocks towards a second carry skip adder block, at a second end of the plurality of carry skip adder blocks.

6. The adder implemented in the FPGA of claim 1, wherein:

at least one of the plurality of carry skip adder blocks includes a wide AND gate logic for fast block propagate carry generation.

7. The adder implemented in the FPGA of claim 1, wherein the adder has two or more features from a feature set consisting of:

a first feature comprising an adder structure that uses routed propagate and generate signals from adder logic to create carry skip adder structures;

a second feature comprising variable carry skip block sizes to hide routing delay associated with generating group propagate and generate signals;

a third feature comprising customized block sizes in the adder structure to trade-off adder area for performance; and a fourth feature comprising a ripple carry structure to generate a wide AND for the function of fast block propagate generation.

8. An adder implemented in a field programmable gate array (FPGA), comprising:

a first ripple carry adder block having two or more one bit-width adders, for two or more least significant bits of the adder;

a plurality of carry skip adder blocks of differing block sizes, each block size relating to bit-width of input to a block, for a plurality of bits of the adder;

each carry skip adder block implemented in the FPGA using a multi-level lookup table (LUT) comprising a plurality of cascaded multiplexer stages configured to implement at least a half-adder function, wherein a block carry propagate signal of the carry skip adder block is derived from internal circuitry of the half-adder function, the internal circuitry being distinct from a normal LUT output, and wherein the block carry propagate signal is exposed for external routing outside of the half-adder function and outside of the multi-level LUT for use across LUT boundaries; and a second ripple carry adder block having two or more one bit-width adders, for two or more most significant bits of the adder.

9. The adder implemented in the FPGA of claim 8, wherein:

each of the plurality of carry skip adder blocks coupled to receive as inputs routed propagate carry and generate carry signals from full adder logic blocks in a skip adder structure.

10. The adder implemented in the FPGA of claim 8, wherein:

critical path delay for a carry of the adder is lower in comparison to critical path delay for a carry of a ripple carry adder that could be implemented in the FPGA as having a same overall input bit-width as the adder.

11. The adder implemented in the FPGA of claim 8, wherein:

area of the adder, in the FPGA, is lower in comparison to an area of a further carry skip adder that could be implemented in the FPGA composed of carry skip adder blocks having a fixed block size equal to a largest of the differing block sizes of the plurality of carry skip adder blocks of the adder.

12. The adder implemented in the FPGA of claim 8, wherein:

the differing block sizes increase from a first carry skip adder block, at a first end of the plurality of carry skip adder blocks, towards at least one carry skip adder block in a middle of the plurality of carry skip adder blocks and decrease from the at least one carry skip adder block in the middle of the plurality of carry skip adder blocks towards a second carry skip adder block, at a second end of the plurality of carry skip adder blocks.

13. The adder implemented in the FPGA of claim 8, wherein:

at least one of the plurality of carry skip adder blocks includes a wide AND gate logic for fast block propagate carry generation.

14. The adder implemented in the FPGA of claim 8, wherein the adder has two or more features from a feature set consisting of:

a first feature comprising an adder structure that uses routed propagate and generate signals from adder logic to create carry skip adder structures;

a second feature comprising variable carry skip block sizes to hide routing delay associated with generating group propagate and generate signals;

a third feature comprising customized block sizes in the adder structure to trade-off adder area for performance; and a fourth feature comprising a ripple carry structure to generate a wide AND for the function of fast block propagate generation.

15. An adder implemented in a field programmable gate array (FPGA), comprising:

a first ripple carry adder block, for least significant bits of the adder;

a plurality of carry skip adder blocks of differing block sizes, each block size relating to bit-width of input to a block, for a plurality of bits of the adder; and a second ripple carry adder block, for most significant bits of the adder;

wherein lookup tables (LUT) as blocks in the FPGA are decomposed to implement propagate carry, generate carry and sum functions in the adder, and wherein each carry skip adder block is implemented using a multi-level LUT comprising a plurality of cascaded multiplexer stages that implement a half-adder function, and wherein a block carry propagate signal is obtained from internal circuitry of the half-adder function, the internal circuitry being distinct from a normal LUT output, and is exposed for external routing outside the multi-level LUT to bypass intermediate carry stages across multiple LUTs.

16. The adder implemented in the FPGA of claim 15, wherein:

each of the plurality of carry skip adder blocks coupled to receive as inputs routed propagate carry and generate carry signals from full adder logic blocks in a skip adder structure.

17. The adder implemented in the FPGA of claim 15, wherein:

critical path delay for a carry of the adder is lower in comparison to critical path delay for a carry of a ripple carry adder that could be implemented in the FPGA as having a same overall input bit-width as the adder.

18. The adder implemented in the FPGA of claim 15, wherein:

area of the adder, in the FPGA, is lower in comparison to an area of a further carry skip adder that could be implemented in the FPGA composed of carry skip adder blocks having a fixed block size equal to a largest of the differing block sizes of the plurality of carry skip adder blocks of the adder.

19. The adder implemented in the FPGA of claim 15, wherein:

the differing block sizes increase from a first carry skip adder block, at a first end of the plurality of carry skip adder blocks, towards at least one carry skip adder block in a middle of the plurality of carry skip adder blocks and decrease from the at least one carry skip adder block in the middle of the plurality of carry skip adder blocks towards a second carry skip adder block, at a second end of the plurality of carry skip adder blocks.

20. The adder implemented in the FPGA of claim 15, wherein:

at least one of the plurality of carry skip adder blocks includes a wide AND gate logic for fast block propagate carry generation.

21. The adder implemented in the FPGA of claim 15, wherein the adder has two or more features from a feature set consisting of:

a first feature comprising an adder structure that uses routed propagate and generate signals from adder logic to create carry skip adder structures;

a second feature comprising variable carry skip block sizes to hide routing delay associated with generating group propagate and generate signals;

a third feature comprising customized block sizes in the adder structure to trade-off adder area for performance; and a fourth feature comprising a ripple carry structure to generate a wide AND for the function of fast block propagate generation.

* * * * *